(12) United States Patent
Takahama

(10) Patent No.: US 9,520,839 B2
(45) Date of Patent: Dec. 13, 2016

(54) PROTECTION DEVICE

(71) Applicant: Onkyo & Pioneer Technology Corporation, Osaka (JP)

(72) Inventor: Koji Takahama, Osaka (JP)

(73) Assignee: ONKYO & PIONEER TECHNOLOGY CORPORATION, Osaka (JP)

( * ) Notice: Subject to any disclaimer, the term of this patent is extended or adjusted under 35 U.S.C. 154(b) by 0 days.

(21) Appl. No.: 14/955,456

(22) Filed: Dec. 1, 2015

(65) Prior Publication Data

US 2016/0191000 A1 Jun. 30, 2016

(30) Foreign Application Priority Data

Dec. 25, 2014 (JP) ................................. 2014-261442

(51) Int. Cl.
| | |
|---|---|
| H03F 1/52 | (2006.01) |
| H03F 3/30 | (2006.01) |
| G01R 19/165 | (2006.01) |
| H03F 3/183 | (2006.01) |

(52) U.S. Cl.
CPC ........... *H03F 1/52* (2013.01); *G01R 19/16509* (2013.01); *H03F 3/183* (2013.01); *H03F 3/3071* (2013.01); *H03F 2200/03* (2013.01)

(58) Field of Classification Search
CPC ........................................................ H03F 1/52
USPC ............................................... 330/298, 207 P
See application file for complete search history.

(56) References Cited

U.S. PATENT DOCUMENTS

| | | | | |
|---|---|---|---|---|
| 2,480,115 | A | * 8/1949 | Brown | ................... G08C 19/12 455/210 |
| 4,379,209 | A | 4/1983 | Sakano | |
| 4,427,951 | A | * 1/1984 | Amada | ................. H03F 1/0222 330/297 |

(Continued)

FOREIGN PATENT DOCUMENTS

| | | |
|---|---|---|
| EP | 0 570 617 A1 | 11/1993 |
| GB | 2 070 369 A | 9/1981 |

(Continued)

*Primary Examiner* — Henry Choe
(74) *Attorney, Agent, or Firm* — Renner, Otto, Boisselle & Sklar, LLP

(57) ABSTRACT

In a protection device of a current amplifier circuit, to protect the current amplifier circuit against more high-speed operation than recovery time of a relay device and to protect operation of the current amplifier circuit in a wide range from low frequency side to high frequency side.

A protection device 30 includes a detection circuit 32 that detects an abnormal current value of a current amplifier circuit 14 and outputs a first abnormality detection signal. The protection device 30 outputs a second abnormality detection signal continuously for predetermined time that starts from output timing of the first abnormality detection signal, turns down an input voltage value to the current amplifier circuit 14 at receiving timing of the second abnormality detection signal, and outputs a cutting command signal to a relay device 36 at the same timing. The detection circuit 32 includes a load line detection unit 42 that detects abnormality by a current value on a load line and a pulse response characteristic changing unit 44 changes frequency characteristic of abnormality detection operation by the load line detection unit 42.

9 Claims, 10 Drawing Sheets

(56) References Cited

U.S. PATENT DOCUMENTS

| | | | |
|---|---|---|---|
| 5,383,083 A | 1/1995 | Shinoda et al. | |
| 5,568,342 A | 10/1996 | Tavazzani et al. | |
| 6,653,899 B2 * | 11/2003 | Organvidez | H03F 1/52 330/207 P |
| 7,394,312 B2 * | 7/2008 | Schoenberger | H03F 1/52 330/207 P |
| 7,449,959 B2 * | 11/2008 | Baldwin | H03F 1/52 330/207 P |

FOREIGN PATENT DOCUMENTS

| | | |
|---|---|---|
| JP | 2559568 | 12/1996 |
| JP | 09-266412 | 10/1997 |
| JP | 2009-268013 | 11/2009 |

\* cited by examiner (a)

(b)

(c)

(d)

(e)

(f)

(g)

(h)

(a)

(b)

PROTECTION DEVICE

BACKGROUND OF THE INVENTION

1. Field of the Invention

The present invention relates to a protection device, especially, the protection device that protects a current amplifier circuit against abnormal state of overcurrent.

2. Description of the Related Art

When abnormal state that output short circuit current flows into a current amplifier circuit of a power amplifier occurs, it is necessary to protect the current amplifier circuit by cutting output current quickly. Secure means for cutting the output current is a relay device. The relay device has delay time by mechanism operation. When input signal of the current amplifier circuit is high-speed, cutting by the relay device is delay in some cases. Accordingly, when area of safe operation of the current amplifier circuit is dropped to low-speed side in accordance with so-called recovery time that is from the time when supply of driving voltage is cut to the time when contacts are separated and connection is cut, the area of safe operation with a single pulse of output element is not used effectively.

In JP2559568 B, acircuit that protects an amplifier against abnormal state of excessive output current when turning on is disclosed. The circuit includes a generation unit that operates by trigger pulse and outputs turn off command signal for predetermined time that is started from timing that abnormal state of the amplifier occurs, a detection circuit that detects abnormal state of the amplifier, an OR circuit that performs OR operation of a turn off command signal and a turn on signal, and an AND circuit that performs AND operation of output of the OR circuit and output of the detection circuit. The amplifier is turned off by an OR circuit that performs OR operation of output of the AND circuit and the turn off command signal.

In JP H09-266412 A, a protection device of an element for electric power amplification is disclosed. The protection device sets predetermined area of safe operation based on polygonal line that is approximated to the maximum allowable electric power loss curve of the element for electric power amplification. The protection device includes a transistor that limits base current of the element for electric power amplification based on voltage that is generated at both ends of a resistor that detects collector current of the element for electric amplification. Herein, the maximum allowable electric power loss curve of the element for electric power amplification is a curve at DC operation. In the invention that is described in JP H09-266412 A, although larger current can be flown with a single pulse, protection is performed.

According to method of JP 2559568 B, circulation state that abnormal state is fixed when an abnormality detection signal is detected and the amplifier is turned off and the amplifier is back to the abnormal state again when the amplifier is turned on can be prevented. However, the area of safe operation is used effectively at single pulse operation and the amplifier is protected is not described at all. According to the method of JP H09-266412 A, an area that cannot be operated within the area of safe operation with DC of the element for electric amplification can be less as less as possible. However, operation of the element for electric power amplification in wide range from a DC area to a single pulse area cannot be protected effectively.

SUMMARY OF THE INVENTION

An objective of the present invention is to provide a protection device that can protect a current amplifier circuit against more high-speed operation than a recovery time of a relay device. Another objective of the present invention is to provide a protection device that can protect operation of a current amplifier circuit in a frequency area of wide range from a DC area to a single pulse area.

A protection device comprising: a detection circuit that detects an output current value of a current amplifier circuit and outputs a first abnormality detection signal when the output current value is an abnormal current value; a maintenance circuit that outputs a second abnormality detection signal continuously for predetermined maintenance time that is started from output timing of the first abnormality detection signal; a relay device that cuts connection between the current amplifier circuit and a load from timing that supply of driving voltage is cut and after recovery time that is mechanism cutting delay time; a protection mute unit that outputs a mute control signal at timing that the second abnormality detection signal is received; a mute circuit that includes function to turn down an input voltage value to the current amplifier circuit at timing that the mute control signal is received; and a protection relay command unit that cuts supply of the driving voltage at timing that the second abnormality detection signal is received, wherein the detection circuit includes a load line detection unit that detects abnormality by a current value on a load line based on a power source voltage value of the current amplifier circuit and a resistor value of the load, and a pulse response characteristic changing unit that changes pulse response characteristic of abnormality detection operation by the load line detection unit.

According to a protection device of the above described configuration, when an abnormal current value is detected, a second abnormality detection signal is output continuously for predetermined maintenance time that is started from the detection timing. Input voltage value to the current amplifier circuit is turned down at timing that the second abnormality detection signal is received and supply of driving voltage to a relay device is cut at the same timing. Thus, even if a relay device has recovery time, the input voltage value of the current amplifier circuit is turned down before the recovery time. The current amplifier circuit can be protected against operation of pulse width shorter than the recovery time of the relay device.

Further, a detection circuit detects abnormality by current value on a load line based on power source voltage of the current amplifier circuit and a resistor value of a load. When the load short-circuits, a larger abnormal current value than the current value on the load line flows. Since the abnormal current value is detected, an allowable operation area of the current amplifier circuit can be wide appropriately compared with a method of detecting a larger abnormal current value that exceeds a predetermined threshold current value.

Further, since the detection circuit changes pulse response characteristic of abnormality detection operation by a load line detection unit, allowable operation range in which output of the current amplifier circuit is short pulse width can be approximated to the area of safe operation at single pulse operation.

Preferably, wherein the predetermined maintenance time is set longer than the recovery time.

Further, in the protection device, since predetermined maintenance time is set longer than predetermined recovery time, the input voltage value to the current amplifier circuit is turned down continuously until the relay device performs cutting operation. Thus, the current amplifier circuit can be protected against operation of shorter pulse width than the recovery time of the relay device securely.

Preferably, wherein the load line detection unit includes a bridge circuit that changes a control voltage value of an abnormality detection element that detects an abnormal current value depending on a resistor value of the load.

Further, the protection device includes a bridge circuit that changes a control voltage value of an abnormality detection element that detects an abnormal current value depending on the resistor value of the load. Thus, the current value on the load line based on the power source voltage of the current amplifier circuit and the resistor value of the load can be an abnormality detection operation point.

Preferably, wherein the pulse response characteristic changing unit includes a lag lead filter circuit that changes pulse response characteristic of the bridge circuit depending on pulse width of the current amplifier circuit.

Further, the protection device includes a lag lead filter circuit that changes frequency response characteristic of the bridge circuit depending on frequency of the input voltage value to the current amplifier circuit. Thus, since setting of constant of the lag lead filter circuit is only changed, the pulse response characteristic of the abnormality detection operation by the load line detection unit can be changed.

Preferably, wherein the bridge circuit includes a first bridge circuit that handles an abnormal current value of a positive side output current value of the current amplifier circuit, and a second bridge circuit that handles an abnormal current value of a negative side output current value of the current amplifier circuit.

Further, in the protection device, since the bridge circuit includes a first bridge circuit that handles the abnormal current value of a positive side output current value of the current amplifier circuit and a second bridge circuit that handles the abnormal current value of a negative side output current value of the current amplifier circuit, operation of the current amplifier circuit in operation voltage range of positive and negative can be protected.

Preferably, wherein the detection circuit includes a first transistor of NPN type in which a base is connected to the load line detection unit and the pulse response characteristic changing unit via a first resistor, an emitter is connected to the load line detection unit and the pulse response characteristic changing unit via a second resistor, and a collector is connected to the maintenance circuit via a third resistor, the maintenance circuit includes a second transistor of PNP type in which a base is connected to the collector of the first transistor via the third resistor, an emitter is connected to a power source, and a collector is connected to a microcomputer via a fourth resistor and that generates abnormality detection voltage as the abnormality detection signal at the collector, and a third transistor of NPN type in which a base is connected to collector of the second transistor via a condenser and a fifth resistor, an emitter is connected to the ground potential, and a collector is connected to the protection mute circuit and base of the second transistor via a sixth resistor and generates abnormality detection voltage as the second abnormality detection signal at collector.

Further, in the protection device, a second transistor converts (level-shifts) a detection signal that is generated by the detection circuit into voltage that can be input to a microcomputer. The second transistor sets a third transistor ON by charging a condenser. The third transistor performs monostable multivibrator operation by connecting a collector to a base of the second transistor and sustains the second abnormality detection signal via a sixth resister.

Preferably, wherein the protection mute unit include a fourth transistor of PNP type in which a base is connected to the maintenance circuit via a diode, an emitter is connected to a power source, and a collector is connected to the mute circuit.

Preferably, wherein the protection mute unit include a fourth transistor of NPN type in which a base is connected to the maintenance circuit via a diode, an emitter is connected to a power source, and a collector is connected to the mute circuit.

Further, in the protection device, when the second abnormality detection signal is output from a maintenance circuit, a fourth transistor is ON state and a protection mute unit outputs high level voltage as a mute control signal.

DETAILED DESCRIPTION OF THE PREFERRED EMBODIMENTS

An embodiment of the present invention is described in detail below with reference to figures. In all figures, the same reference number is added to a corresponding element and description that is overlapped is omitted below.

Figure 1:
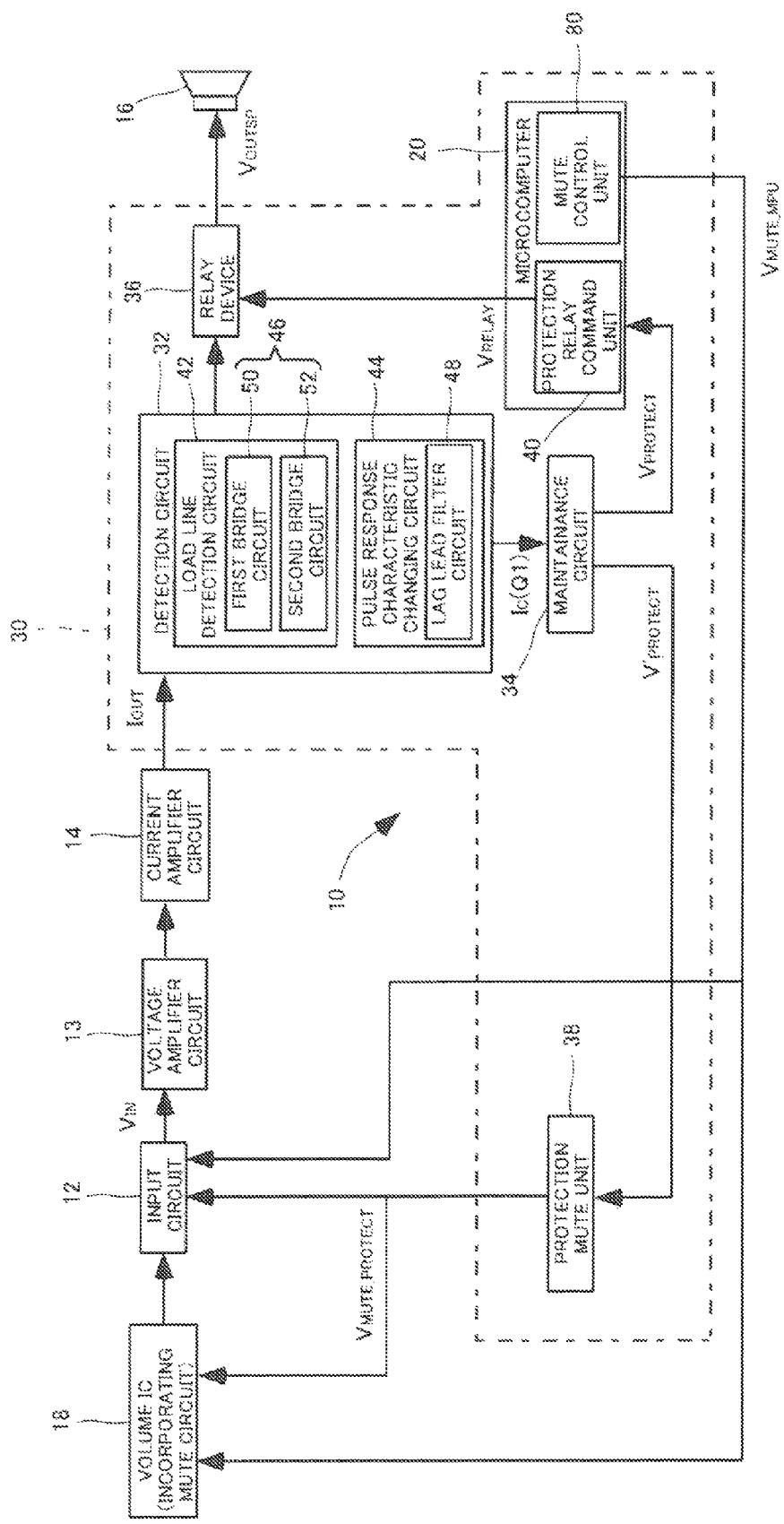
FIG. 1 is a configuration diagram illustrating an electric power amplifier device including a protection device according to an embodiment of the present invention.
Figure 2:
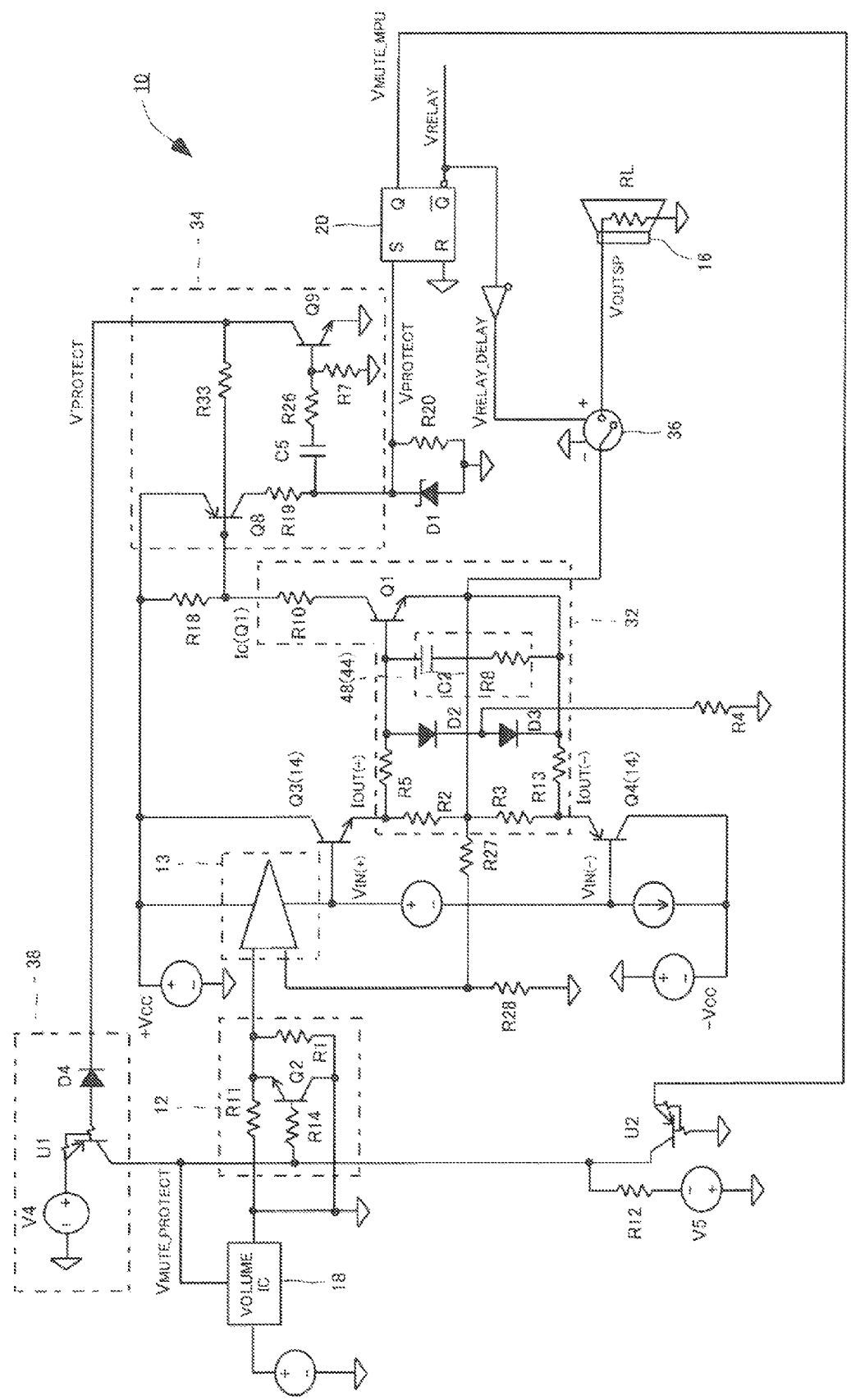
FIG. 2 is a detailed circuit diagram of the electric power amplifier device including the protection device according to the embodiment of the present invention.

FIG. 1 is a block diagram illustrating a configuration of an electric power amplifier device 10 including a protection device 30. FIG. 2 is a detailed circuit diagram of the electric power amplifier device 10.

The electric power amplifier 10 includes an input circuit 12, a voltage amplifier circuit 13, a current amplifier circuit 14, a speaker 16, a volume IC 18, a microcomputer 20, and the protection device 30.

The input circuit 12 supplies an input voltage value $V_{IN}$ to the voltage amplifier circuit 13. There are cases where the input circuit 12 includes a mute circuit. When the mute circuit operates, volume of the speaker 16 is turned down and an output current value $I_{OUT}$ of the current amplifier circuit 14 becomes small drastically. In FIG. 2, a mute transistor Q2 (an NPN transistor) as the mute circuit is included. As illustrated in FIG. 2, the current amplifier 14 is a configuration that an emitter of an NPN transistor Q3 and an emitter of a PNP transistor Q4 face each other, resistors R2 and R3 are provided between the emitters, and the emitters are connected in series. Amplified power is supplied to the speaker 16 that is a load device from a connecting point of R2 and R3.

As illustrated in FIG. 2, a collector of Q3 is connected to a power source $+V_{CC}$. A collector of Q4 is connected to a power source $-V_{CC}$. $+V_{CC}$ is a positive power source against GND (=0V). $-V_{CC}$ is a negative power source against GND (=0V). The input voltage value $V_{IN}$ supplies a positive input voltage signal $V_{IN}(+)$ against Q3 and supplies a negative input voltage signal $V_{IN}(-)$ against Q4. Each of $V_{IN}(+)$ and $V_{IN}(-)$ is an AC signal. Each of $I_{OUT}(+)$ and $I_{OUT}(-)$ is an AC signal.

Operation frequency range of the current amplifier circuit 14 is from about several Hz (DC) to 100 kHz. Relation between operation voltage value that the current amplifier circuit 14 can operate safely, output current value, and pulse width is called Area of Safe Operation (ASO). Generally, when the operation voltage value is lower, the output current value that is allowed is higher. When the pulse width is wider, the output current value that is allowed is lower. When the pulse width is narrower, the output current value that is allowed is higher. Detail of the area of safe operation will be described later.

The speaker 16 is the load device of the electric power amplifier device 10 and not an element of the electric power amplifier device 10. The speaker 16 is an example for describing the load device. The load device may be a vibrator, an excitation device, or the like. In FIG. 2, the speaker 16 that is the load device is illustrated by a load resistor RL.

The volume IC 18 is connected to the input circuit 12 and increases or decreases the volume of the speaker 16 that is the load device. There are cases where the volume IC 18 includes a mute circuit that turns down the volume of the speaker 16. When the mute circuit operates, the volume of the speaker 16 is turned down and the output current value $I_{OUT}$ of the current amplifier circuit 14 becomes small drastically.

The microcomputer 20 integrates and controls operation of respective elements composing the electric power amplifier device 10 as a whole. For example, the microcomputer 20 controls operation of the volume IC 18 and controls operation of the relay device 36 included in the protection device 30.

The protection device 30 detects that the output current value of the current amplifier circuit 14 is out of the area of safe operation by short circuit and the like, and protects the current amplifier circuit 14 against damage by cutting the output current. The protection device 30 includes a detection circuit 32, a maintenance circuit 34, a protection mute unit 38, and a protection relay commend unit 40 included in the microcomputer 20.

The detection circuit 32 is provided between the current amplifier circuit 14 and the speaker 16 that is the load device and monitors current value that is flown from the current amplifier circuit 14 to the speaker 16. Function of the detection circuit 32 is abnormality detection that the detection circuit 32 measures the output current value $I_{OUT}$ of the current amplifier circuit 14 and outputs a first abnormality detection signal $I_C(Q1)$ when the output current value $I_{OUT}$ measured is an abnormal current value. The detection circuit 32 does not perform any processing against the output current value $I_{OUT}$ itself. The output current value $I_{OUT}$ passes the detection circuit 32 as it is and flows into the speaker 16 via the relay device 36.

The detection circuit 32 includes a load line detection unit 42 and a pulse response characteristic changing unit 44. The load line detection unit 42 includes a bridge circuit 46. The pulse response characteristic changing unit 44 includes a lag lead filter circuit 48. Further, the bridge circuit 46 includes a first bridge circuit 50 and a second bridge circuit 52. Detail of the load line detection unit 42 and the pulse response characteristic changing unit 44 will be described later with reference to FIG. 6.

The maintenance circuit 34 continuously outputs second abnormality detection signals $V_{PROTECT}$ and $V'_{PROTECT}$ for predetermined maintenance time $T_{PROTECT}$ that is started from output timing of the first abnormality detection signal $I_C(Q1)$. The maintenance circuit 34 outputs the second abnormality detection signal $V_{PROTECT}$ to the microcomputer 20 and the second abnormality detection signal $V'_{PROTECT}$ to the protection mute unit 38. The maintenance circuit 34 outputs the second abnormality detection signals $V_{PROTECT}$ and $V'_{PROTECT}$ in response time that is much quicker than response time of the relay device 36.

The maintenance circuit 34 includes a PNP transistor Q8, an NPN transistor Q9, a condenser C5, and resistors R7, R19, R26 and R33. A base of the PNP transistor Q8 (a second transistor) is connected to the detection circuit 32 (the base of Q1) via a resistor R10 (a third resistor). A collector of Q8 is connected to the power source $+V_{CC}$. The collector of Q8 is connected to the microcomputer 20 via a resistor R19 (a fourth resistor). Q8 outputs abnormality detection voltage as the second abnormality detection signal $V_{PROTECT}$ to the collector.

A base of the NPN transistor Q9 (a third transistor) is connected to the collector of Q8 via the condenser C5 and the resistor R26 (a fifth resistor). An emitter of Q9 is connected to ground potential. A collector of Q9 is connected to the protection mute unit 38 (a base of a PNP transistor U1). The collector of Q9 is connected to the base of Q8 via the resistor R33 (a sixth resistor). Q9 outputs abnormality detection voltage as the second abnormality detection signal $V'_{PROTECT}$ to the collector. A one shot circuit is configured by Q9, C5, R26 and R7. R26 is provided between C5 and the base of Q9. R7 is connected between R26 and the base of Q9 at one end and is connected to the ground potential at the other end.

The relay device 36 connects or cuts the current amplifier circuit 14 and the speaker 16 that is the load device by driving voltage $V_{RELAY}$. The relay device 36 is ON state when the driving voltage $V_{RELAY}$ is supplied. The relay device 36 is OFF state when supply of the driving voltage $V_{RELAY}$ is cut. Since the relay device 36 is a mechanical switch device, time is needed from timing that supply of the driving voltage $V_{RELAY}$ is cut to timing that the relay device 36 transfers from connecting (ON) state to cutting (OFF) state actually. That time is called recovery time $T_D$ (see FIG. 3(g)). For example, the recovery time $T_D$ is about 1 ms to about 10 ms although it depends on specification of the relay device 36.

The protection mute unit 38 outputs a mute control signal $V_{MUTE\_PROTECT}$ (see FIG. 3(d)) to the mute circuit of the volume IC 18 or the input circuit 12. When the protection mute unit 38 receives the second abnormality detection signal $V'_{PROTECT}$ it outputs the mute control signal $V_{MUTE\_PROTECT}$ that is a command signal turning down the input voltage value $V_{IN}$ to the mute circuit of the volume IC 18 or the input circuit 12 while receiving the second abnormality detection signal V'$_{PROTECT}$. Since the protection mute unit 38 is also an electronic circuit, it outputs the mute control signal V$_{MUTE\_PROTECT}$ that is a command signal turning down the input voltage value V$_{IN}$ to the mute circuit of the volume IC 18 or the input circuit 12 in timing receiving the second abnormality signal V'$_{PROTECT}$, namely, in the about same timing as the timing receiving the second abnormality detection signal V$_{PROTECT}$.

The protection mute unit 38 includes a PNP transistor U1 (a fourth transistor) and a diode D4. A base of U1 is connected to the maintenance circuit 34 (the collector of Q9) via D4. A collector of U1 is connected to the mute circuit, namely, a mute terminal of the volume IC 18 or the input circuit 12 (a base of the mute transistor Q2). When the second abnormality detection signal V'$_{PROTECT}$ (high level signal) is output to the protection mute unit 38, U1 is OFF state. When U1 is OFF state, the mute control signal V$_{MUTE\_PROTECT}$ (high level signal) is output to the volume IC 18 or the input circuit 12.

The mute control unit 80 is one of functions included in the microcomputer 20, and outputs the mute control signal V$_{MUTE\_MPU}$ to the volume IC 18 or the mute circuit of the input circuit 12 so as to perform mute processing. Turning down the volume of the speaker 16 (mute processing) is usually performed by outputting V$_{MUTE\_MPU}$ to the volume IC 18 or the mute circuit of the input circuit 12 by function of the microcomputer 20. When the first abnormality detection signal I$_C$(Q1) is detected, V$_{MUTE\_PROTECT}$ is output to the volume IC 18 or the mute circuit of the input device 12 through a route of electric circuits, that is, the detection circuit 32—the maintenance circuit 34—the protection mute unit 38. The volume IC 18 or the mute circuit of the input circuit 12 is an electronic circuit. For this reason, after the volume IC 18 or the mute circuit of the input circuit 12 receives V$_{MUTE\_PROTECT}$ and time to be needed for signal processing passes, the volume IC 18 or the mute circuit turns down V$_{IN}$. However, the time to be needed for signal processing is much shorter than the recovery time of the relay device 36.

Namely, the first abnormality detection signal I$_C$(Q1) is detected through a route, the detection circuit 32—the maintenance circuit 34—the protection mute unit 38—the volume IC 18 or the input circuit 12—the voltage amplifier circuit 13—the current amplifier circuit 14 and overcurrent state that is abnormal state is fixed instantly. When the overcurrent state is fixed and V$_{MUTE\_PROTECT}$ is removed, the current amplifier circuit 14 is back to the overcurrent state again. To prevent this, the maintenance circuit 34 maintains the second abnormality detection signals V$_{PROTECT}$ and V'$_{PROTECT}$ for the predetermined maintenance time T$_{PROTECT}$. While the protection mute unit 38 is receiving the second abnormality detection signals V$_{PROTECT}$ and V'$_{PROTECT}$, it continuously outputs the mute control signal V$_{MUTE\_PROTECT}$. Thus, after abnormality detection is removed, V$_{IN}$ can be continuously turned down in the volume IC 18 or the input circuit 12.

The protection relay command unit 40 is one of the functions included in the microcomputer 20 and operates when an abnormality detection signal is detected. When the protection relay command unit 40 receives the second abnormality detection signal V$_{PROTECT}$, the protection relay command unit 40 cuts supply of the driving voltage V$_{RELAY}$ to transfer current route between the detection circuit 32 and the speaker 16 from connecting state to cutting state while receiving the second abnormality detection signal V$_{PROTECT}$. The protection relay command unit 40 is a part of the microcomputer 20. After inherent processing time passes from timing that the microcomputer 20 receives the second abnormality detection signal V$_{PROTECT}$, the microcomputer 20 cuts the supply of the driving voltage V$_{RELAY}$.

For example, controlling operation of the relay device 36 is usually performed by function of the microcomputer 20 depending on operation of a user. When the first abnormality detection signal I$_C$(Q1) is detected, the supply of the driving voltage V$_{RELAY}$ is cut through a route, the detection circuit 32—the maintenance circuit 34—the microcomputer 20 (the protection relay command unit 40). The delay time in which supply of the driving voltage V$_{RELAY}$ is cut is different according to processing ability of the microcomputer 20. In a general microcomputer, the delay time is about 1 ms.

The above described configuration, especially, operation from when the first abnormality detection signal I$_C$(Q1) is output to when the relay device 36 is cut will be described in detail with reference to FIG. 2 and FIG. 3.

In FIG. 2, the current amplifier circuit 14 is configured by the NPN transistor Q3 that amplifies current of +V$_{IN}$ of +V$_{CC}$ side against GND and the PNP transistor Q4 that amplifies current of -V$_{IN}$ of -V$_{CC}$ side against GND. Since abnormality detection of +V$_{CC}$ side and abnormality detection of -V$_{CC}$ side will be respectively described in detail later in description of the bridge circuit 46, the output current value I$_{OUT}$(+) is described in FIG. 2 and FIG. 3.

When V$_{IN}$(+) that is supplied from the input circuit 12 is amplified by Q3, the output current value I$_{OUT}$(+) is supplied to the speaker 16 that is the load device via R2. Size of the output current value I$_{OUT}$(+) as size of voltage between terminals of R2 is supplied to the base that is a control terminal of the NPN transistor Q1 for abnormality detection via R5. When I$_{OUT}$(+) is large, the base voltage value of Q1 becomes high and Q1 is ON. By setting ON threshold to an abnormal current detection threshold, when Q1 is ON, it can be detected that I$_{OUT}$(+) is an abnormal current value. When Q1 is ON, corrector current I$_C$(Q1) as the first abnormality detection signal is output to a connecting point between R10 and R18 that are connected to the collector of Q1. A circuit from which I$_{OUT}$(+) is output to which I$_C$(Q1) is output corresponds to the detection circuit 32.

When I$_C$(Q1) is output, Q8 is ON and Q9 is ON at rising timing via C5. Until C5 is fully charged, the collector of Q9 maintains L (low) level. Since the collector of Q9 is connected to the base of Q8 via the transistor R33, Q8 maintains ON state. Therefore, ON state of Q9 and Q8 is maintained for predetermined time that is from the timing when I$_C$(Q1) is output to the timing when C5 is fully charged. Q8, Q9 and C5 configure a so-called monostable multivibrator. Even if detection time of abnormal current, namely, time that I$_C$(Q1) is output is in an instant, the maintenance circuit 34 maintains the state for predetermined time. In a conventional circuit, Q8 is a part of a level shift circuit that converts (level-shifts) detection result by the detection circuit 32 into voltage that can be input to the microcomputer 20. In the present embodiment, Q8 is also used for a part of monostable multivibrator function.

Thus, a circuit in which I$_C$(Q1) is output and the state is maintained for predetermined time is the maintenance circuit 34. The predetermined time is the maintenance time T$_{PROTECT}$. When I$_C$(Q1) is output, the signal which maintains the state for the maintenance time T$_{PROTECT}$ is V$_{PROTECT}$ and V'$_{PROTECT}$. The maintenance time T$_{PROTECT}$ can be set by setting of C5.

As illustrated in FIG. 2, V'$_{PROTECT}$ that is drawn from the collector terminal of Q9 in the maintenance circuit 34 is input to the protection mute unit 38 (the base of U1). The protection mute unit 38 outputs the mute control signal $V_{MUTE\_PROTECT}$ to the volume IC 18 or the input circuit 12 depending on $V'_{PROTECT}$ that is input. $V_{PROTECT}$ that is drawn from the connecting point between R19 and C5 is input to the protection relay command unit 40. The protection relay command unit 40 cuts supplying $V_{RELAY}$ to the relay device 36 depending on $V_{PROTECT}$ that is input.

Figure 3:
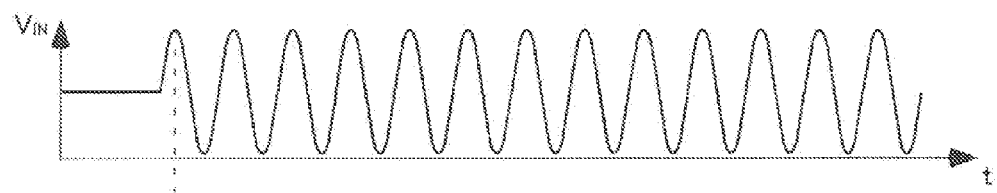
FIG. 3 is a time chart illustrating time change of each voltage value in FIG. 1.
Figure 3:
Figure 3:
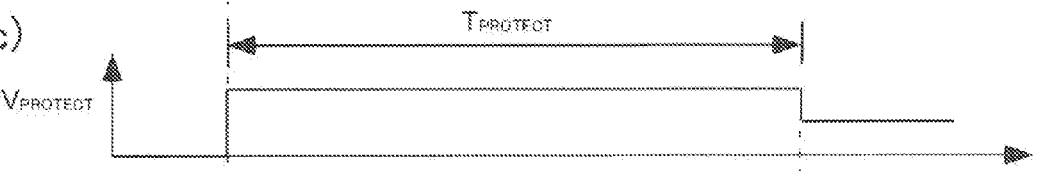
Figure 3:
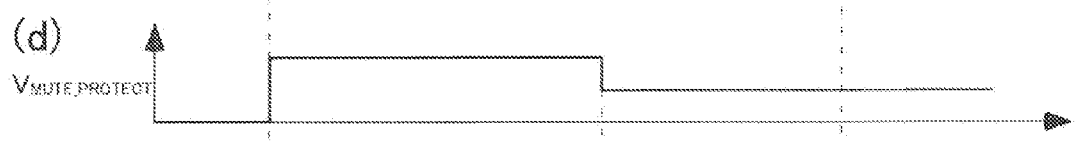
Figure 3:
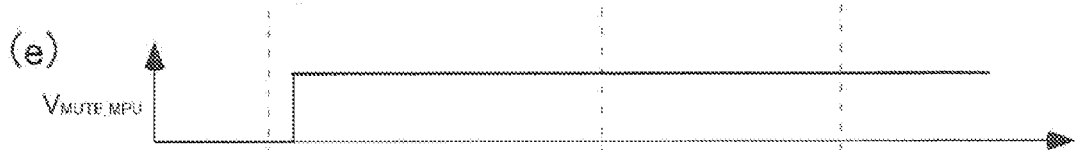
Figure 3:
Figure 3:
Figure 3:
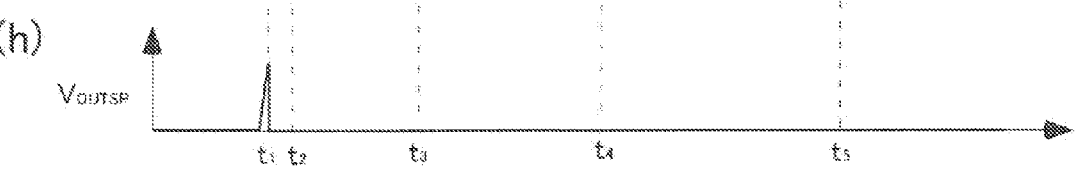

FIG. 3 is a time chart illustrating time change of each voltage value. A horizontal axis illustrates time. A vertical axis of (a) illustrates the input voltage $V_{IN}$. A vertical axis of (b) illustrates the first abnormality detection signal $I_C(Q1)$. A vertical axis of (c) illustrates the second abnormality detection signal $V_{PROTECT}$. A vertical axis of (d) illustrates the mute signal $V_{MUTE\_PROTECT}$ by the protection mute unit 38. A vertical axis of (e) illustrates the mute control signal $V_{MUTE\_MPU}$ that the mute control unit 80 (the microcomputer 20) outputs. A vertical axis of (f) illustrates the driving voltage $V_{RELAY}$ to the relay device 36. A vertical axis of (g) illustrates an actual state $V_{RELAY}$ DELAY connecting (ON) or cutting (OFF) of the relay device 36. A vertical axis of (h) illustrates an output waveform $V_{OUTSP}$ of the speaker 16.

In FIG. 3, time $t_1$ is timing that the detection circuit 32 detects an abnormal current value and outputs the first abnormality detection signal $I_C(Q1)$. The time $t_1$ is timing that the maintenance circuit 34 outputs the second abnormality detection signal $V_{PROTECT}$ depending on output of the first abnormality detection signal $I_C(Q1)$. At about the same time as this timing, $V_{MUTE\_PROTECT}$ is output from the protection mute unit 38. After processing time of the microcomputer 20, $V_{RELAY}$ is cut from the protection relay command unit 40 and the mute control signal $V_{MUTE\_MPU}$ of the mute control unit 80 (the microcomputer 20) rises. Each of rising states and output states of these signals is illustrated as H (high) level. Time that is from the time $t_1$ to the time $t_2$ is about 1 ms, although it depends on the signal processing ability of the microcomputer 20.

At the time $t_1$, the input voltage value $V_{IN}$ to the current amplifier circuit 14 is turned down, the output current value $I_{OUT}$ of the current amplifier circuit 14 decreases, and the first abnormality detection signal $I_C(Q1)$ from the detection circuit 32 is lost. $I_C(Q1)$ is lost and the protection signal $V_{PROTECT}$ maintains H (high) level until C5 is fully charged in the maintenance circuit 34. Time $t_5$ is end timing of $T_{PROTECT}$. The maintenance time $T_{PROTECT}$ is time between $t_2$ and $t_5$ in which $V_{PROTECT}$ maintains H (high) level. $T_{PROTECT}$ is set longer than the recovery time $T_D$ of the relay device 36 sufficiently. For example, $T_{PROTECT}$ is set about 20 ms.

Time $t_3$ is timing that supply of $V_{RELAY}$ DELAY is cut, contacts are separated, and the relay device 36 is completely cutting state. $V_{RELAY}$ DELAY illustrates the connecting state as H (high) level and the cutting state as L (low) level. The recovery time $T_D$ is time that is from the time $t_2$ to the time $t_3$. $T_D$ is about 1 ms to 10 ms.

The time $t_5$ is later than the time $t_3$ sufficiently. The time $t_5$ is timing that charging of C5 is being finished, the base current of Q9 is lost, the collector current of Q9 decreases, and Q8 is OFF. Namely, the time $t_5$ is end timing of output of the second abnormality detection signal $V_{PROTECT}$.

Time $t_4$ is end timing of $V_{MUTE\_PROTECT}$. The time $t_4$ is timing that the base current of Q9 is lost, the collector current of Q9 decreases, and U1 is OFF. Since threshold that Q8 is OFF and threshold that U1 is OFF are different from each other, time difference occurs between the time $t_4$ and the time $t_5$.

According to the above configuration, even if the relay device 36 has the recovery time $T_D$, the input voltage value $V_{IN}$ of the current amplifier circuit 14 is turned down before the recovery time $T_D$. The current amplifier circuit 14 can be protected against more high-speed operation than the recovery time $T_D$ of the relay device 36. In the above example, according to conventional technology that does not have function of the maintenance circuit 34, the current amplifier circuit 14 cannot be protected against abnormal current state of input signal of shorter period than $T_D$ (about 1 ms to 10 ms). According to the above configuration, the current amplifier 14 can be protected against abnormal current state of input signal of a short period, that is a signal processing time of an electronic circuit (up to about 1 ms). As illustrated in FIG. 3 (h), after abnormality is detected, mute is performed at the time $t_1$ quickly and state in which no output from the speaker 16 is maintained.

Next, function of the load line detection unit 42 and the pulse response characteristic changing unit 44 in the detection circuit 32 will be described. Before that, a method using a threshold current value that is generally known as an abnormal current value detection method of a conventional technique is described with reference to FIG. 4 and FIG. 5.

Figure 4:
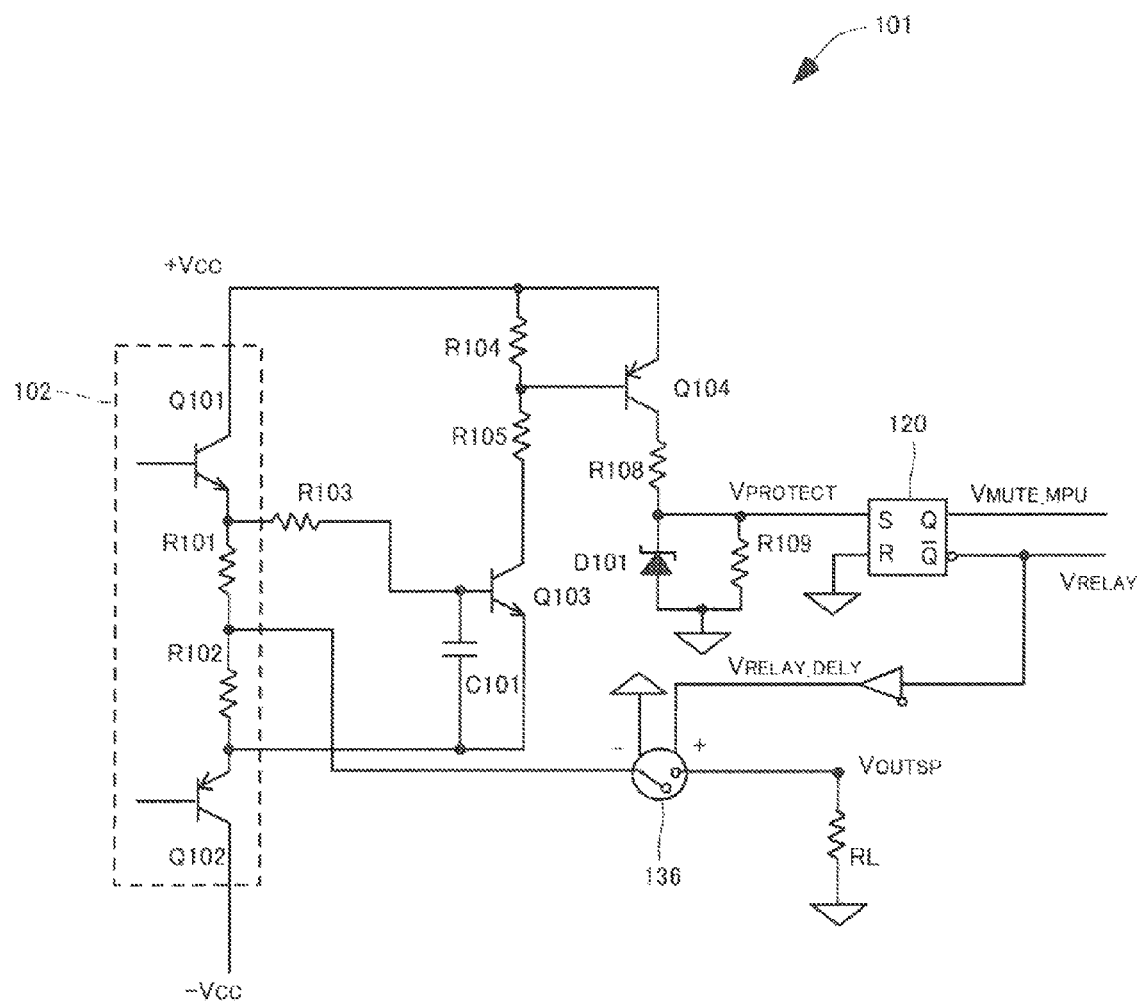
FIG. 4 is a circuit diagram of a protection device according to a conventional technique.

FIG. 4 is a circuit diagram of a conventional protection device that detects abnormal state and protects a current amplifier circuit. In the conventional protection device 101, when an overcurrent flows into an NPN transistor Q101 or a PNP transistor Q102 that configures a current amplifier circuit 102, voltage of a resistor R101 or a resistor R102 rises. When abase voltage of an NPN transistor Q103 becomes more than or equal to predetermined potential against an emitter voltage by risen voltage, Q103 is ON state. When Q103 is ON, a base voltage of a PNP transistor Q104 becomes not more than predetermined voltage against an emitter voltage and the PNP transistor Q104 is ON. Then, voltage of which potential is at high level is supplied to a microcomputer 120 as the abnormality detection signal $V_{PROTECT}$. When the abnormality detection signal $V_{PROTECT}$ is supplied to the microcomputer 120, the microcomputer 120 performs protection of the current amplifier circuit 102 by cutting output to the load RL by the relay device 136 (cutting supply of driving voltage $V_{RELAY}$) and mute processing by a mute circuit (output of mute control signal $V_{MUTE\_MPU}$).

Figure 5:
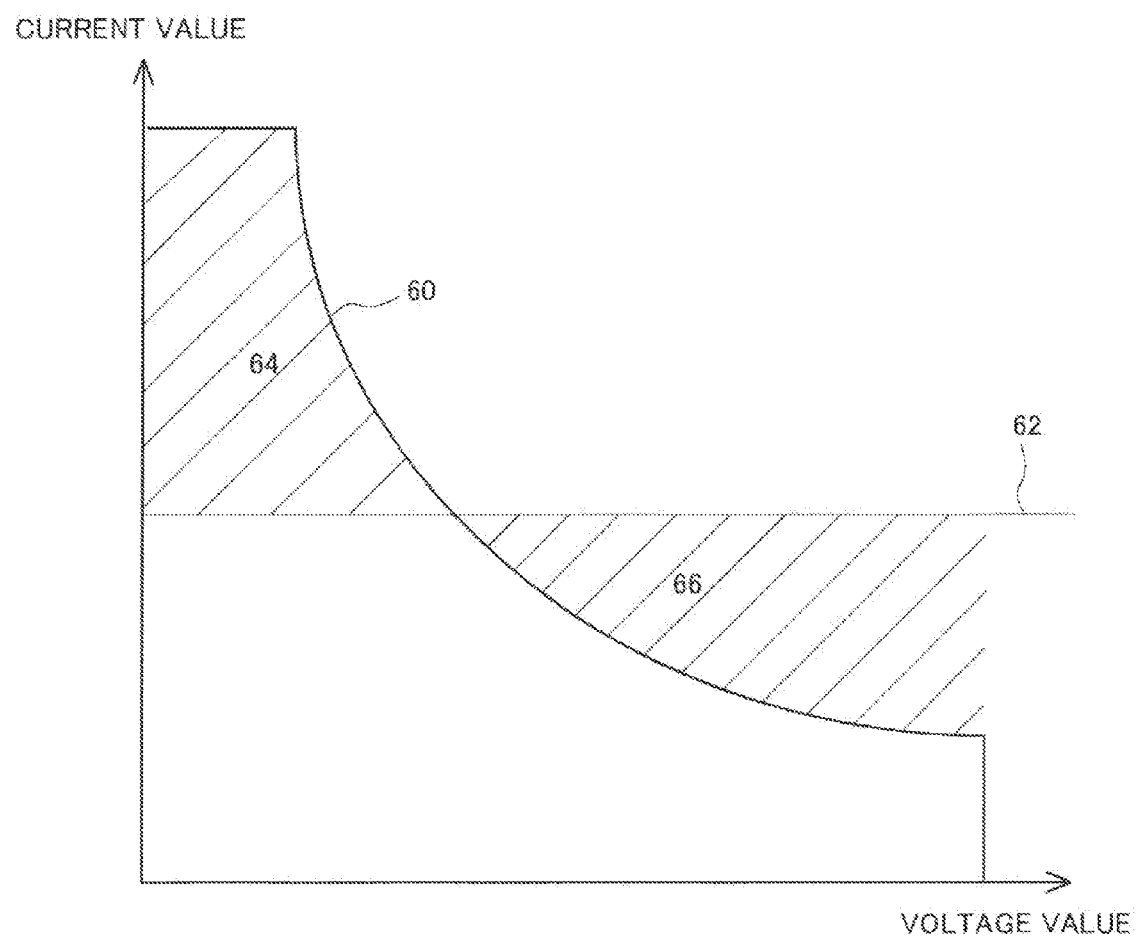
FIG. 5 is a diagram illustrating relation between an area of safe operation and an abnormality detection threshold current value in a conventional technique.

When current that flows into the current amplifier circuit 102 (Q101 or Q102) is more than or equal to a threshold current value, the conventional protection device 101 performs protection. FIG. 5 is a diagram illustrating relation between the area of safe operation and the threshold current value. A horizontal axis illustrates operation voltage value of the current amplifier circuit 102. A vertical axis illustrates output current value of the current amplifier circuit 102. A characteristic line 60 is a border line of the area of safe operation (ASO) that is defined by specification of the current amplifier circuit 102. When the current amplifier circuit 102 operates in an area in smaller electric power side than the characteristic line 60, it operates with predetermined performance. When the current amplifier circuit 102 operates in an area in larger electric power side than the characteristic line 60, it is possible that deterioration and damage occur in the current amplifier circuit 102. Generally, when the operating voltage value is lower, the output current value that is allowed is higher. When pulse width is wider, the output current value that is allowed is lower. When the pulse width is narrower, the output current value that is allowed is higher. The characteristic line 60 in FIG. 5 is a line relating to one pulse width. A characteristic line 62 is a line representing a threshold current value that is used for detecting that the output current value is an abnormal current value. In the conventional protection device 101, the characteristic line 62 is set constant current value, irrespective of a voltage value.

When the output current value of the current amplifier circuit 102 is less than threshold current value that is defined by the characteristic line 62, an abnormality detection signal is not output. When the output current value is more than the threshold current value that is defined by the characteristic line 62, the abnormality detection signal is output. For example, when the threshold current value is 20 A and the output current value is more than 20 A, the abnormality detection signal is output, and supply of the driving voltage to the relay device is cut, for example.

In a method using the threshold current value for abnormality detection, the current amplifier circuit 102 is protected as it is in an abnormal state when the output current value is more than the threshold current value uniformly in whole range of operation voltage of the characteristic line 60 representing the area of safe operation that is defined by specification of the current amplifier circuit 102. Therefore, operating area 64 is protected properly, but area 66 is not protected.

Further, the characteristic line 60 in FIG. 5 is a line relating to one pulse width. When pulse width is wider (to low frequency side), the area of safe operation goes to a small electric power side and is narrower. When the pulse width is narrower (to high frequency side), the area of safe operation goes to a large electric power side and is wider. When the characteristic line 62 of a constant threshold current value is applied to the area of safe operation, the area 66 that is not protected can be narrowed in a low-speed side. Protection is performed in high-speed side although there is a space in the area of safe operation. These are problems of the method of performing abnormality detection using a threshold current value.

The load line detection unit 42 in FIG. 1 and FIG. 2 is one of methods to solve this problem. In the load line detection unit 42, a base that is a control terminal of the NPN transistor Q1 (a first transistor) for abnormality detection is connected to the emitter of Q3 via a transistor R5 (a first resistor) and GND via R4. Function of the load line detection unit 42 is described with reference to FIG. 6.

Figure 6:
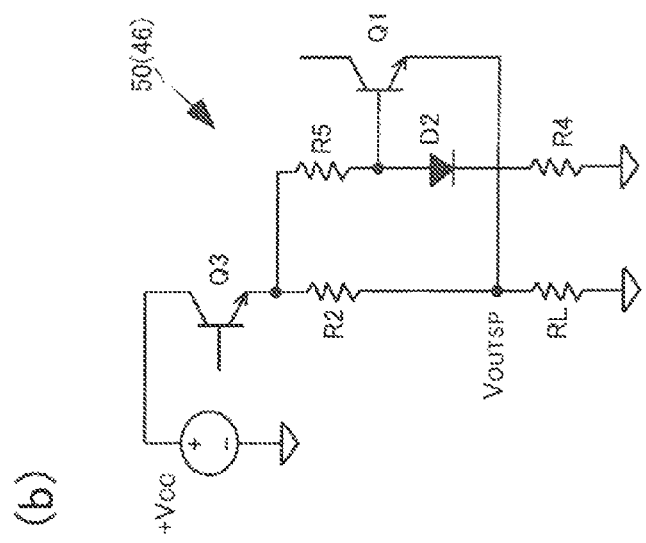
FIG. 6 is a detailed diagram of a first bridge circuit for protecting a positive side element in the protection device according to the embodiment of the present invention.
Figure 6:
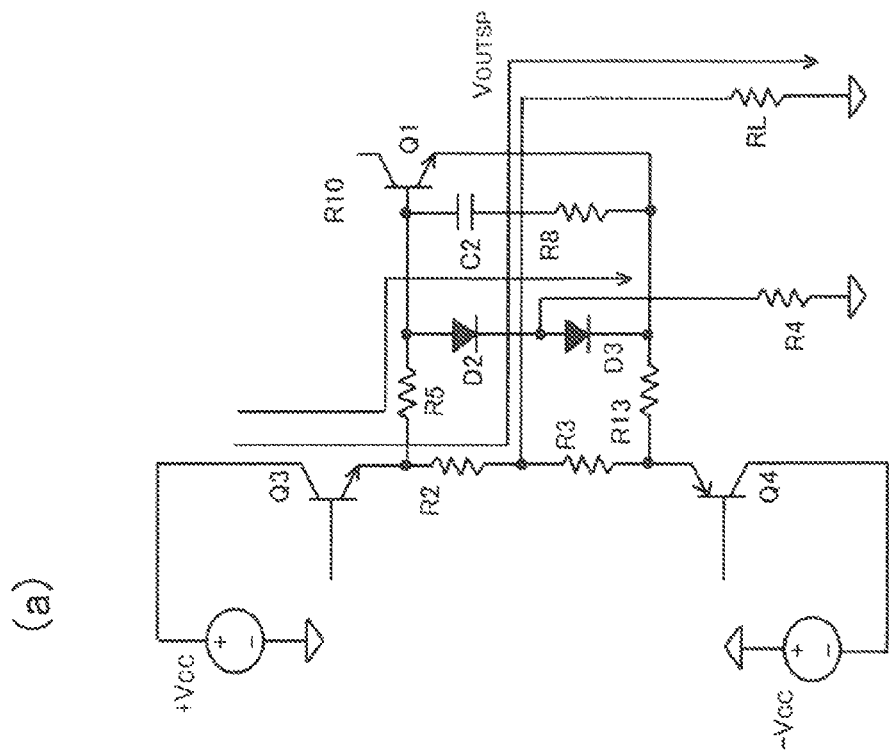

FIG. 6 (a) is a diagram extracting a part that is connected to the base of Q1 about abnormality detection of the output current value $I_{OUT}(+)$ by Q3. FIG. 6 (b) is a diagram extracting a part that configures the first bridge circuit 50 in FIG. 6 (a) schematically. The term "first" of the first bridge circuit 50 is used for being distinguished from the second bridge circuit 52 that is used for abnormality detection of the output current value $I_{OUT}(-)$ that is described next. Two of the first bridge circuit 50 and the second bridge circuit 52 correspond to the bridge circuit 46 in FIG. 1.

In FIG. 6, a connecting point between R5 and R4 is connected to the base that is the control terminal of Q1. A connecting point between R2 and RL is connected to the emitter of Q1. RL is a resistor value of the speaker 16 that is the load device. Under the connecting relation in FIG. 6 (a), flow that two current flows from Q3 to GND is illustrated. As illustrated in FIG. 6 (b), the connecting relation configures the first bridge circuit 50.

In the first bridge circuit 50, the base voltage value of Q1 is decided by resistive dividing ratio of R5 and R4. The emitter voltage value of Q1 is decided by resistive dividing ratio of R2 and RL. Namely, a voltage value between the base and the emitter that decides the voltage value at which Q1 is ON is decided by size relation of R2/RL and R5/R4. Each of R5, R4, and R2 can be set so that Q1 is ON when the speaker 16 is smaller than RL's resistor value by defining concrete value of RL. Namely, each of R5, R4 and R2 can be set so that Q1 is ON when R2/RL is larger than R5/R4.

For example, when the resistor value of the speaker 16 due to specification is 2 ohm, by setting {R2/(RL=2 ohm)=R5/R4}, Q1 is OFF when the speaker 16 operates normally. When the resistor value RL becomes smaller than 2 ohm by short-circuit and R2/RL becomes larger than R5/R4, Q1 can be ON. Thus, abnormal state such as short-circuit can be detected. Abnormality detection operation point of this time is on the load line of RL=2 ohm. The load line is a line based on a power source voltage value of the current amplifier circuit 14 and the resistor value RL of the speaker 16 that is the load. In a current value—voltage value plane in which a horizontal axis illustrates an operation voltage value of the current amplifier circuit 14 and a vertical axis illustrates an output current value of the current amplifier 14, the load line is a line in which that the power voltage value point of the current value circuit 14 in the horizontal axis and the current value point that is calculated by (power voltage value/the resistor value RL) in the horizontal axis are linked.

Figure 7:
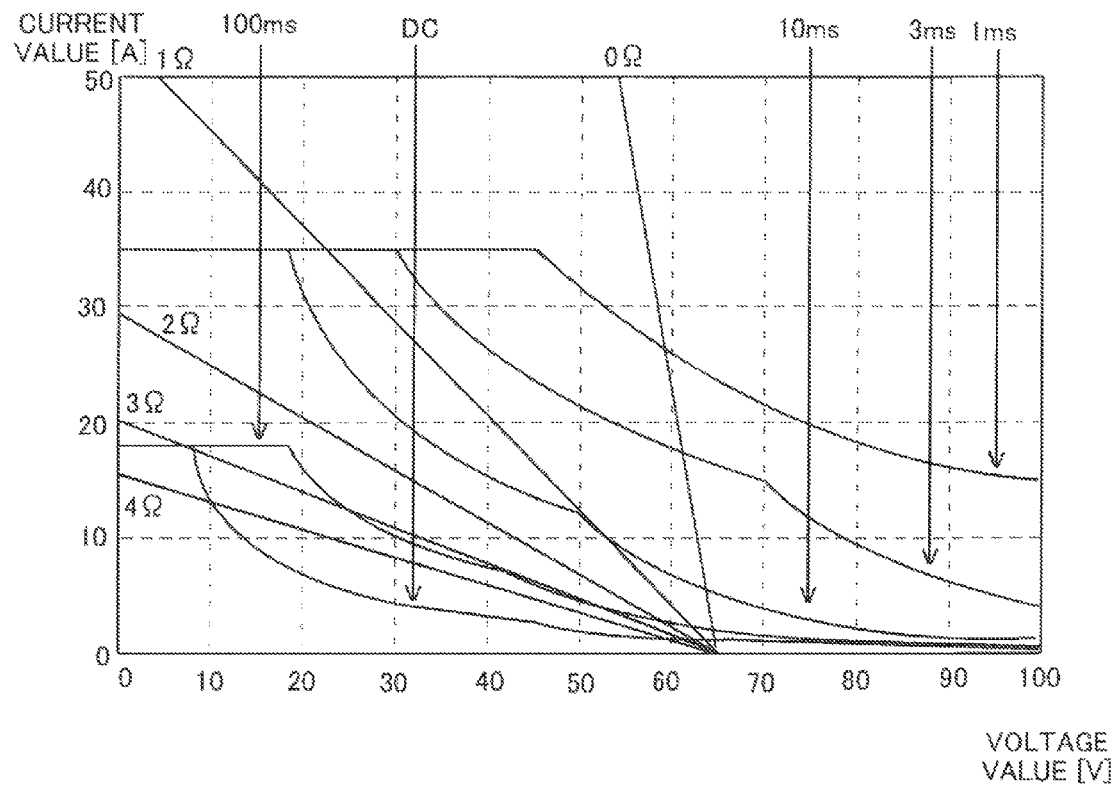
FIG. 7 is a diagram illustrating relation between the area of safe operation, a load resistor, and an abnormality detection operation point in the protection device according to the embodiment of the present invention.
Figure 7:
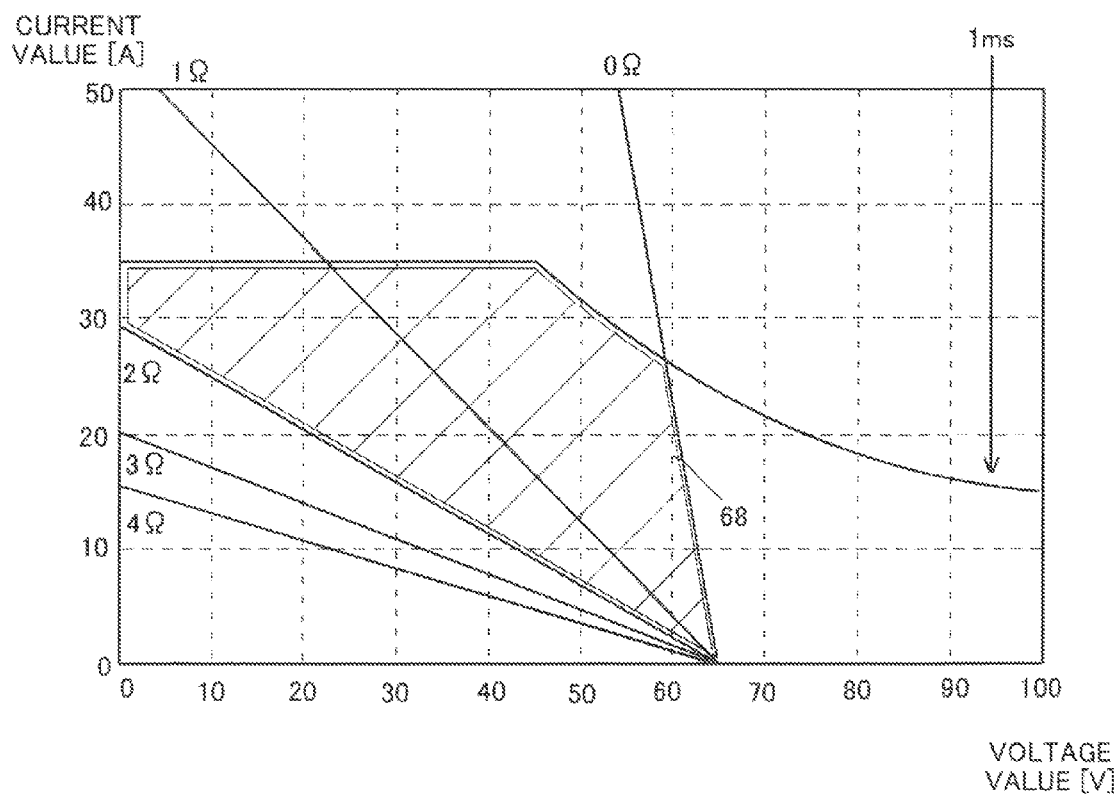

FIG. 7 (a) illustrates examples of the characteristic lines 60 that are border lines of the areas of safe operation and examples of the load lines. The characteristic lines 60 are illustrated when pulse widths corresponding to operation frequency are 1 ms, 3 ms, 10 ms, 100 ms, and DC. In examples in FIG. 7, a current value that defines the areas of safe operation is 18 A in case of DC and 100 ms pulse. The current value is 35 A in case of 1 ms, 3 ms, and 10 ms pulse. 18 A in case of DC and 100 ms pulse and 35 A in case of 1 ms, 3 ms, and 10 ms pulse must not be exceeded in a moment.

In each of characteristic lines 60, a point that drops to the right comes from transient heat resistance. While a pulse continues, the point must not be exceeded.

As illustrated in FIG. 7 (a), in each of characteristic lines 60, when operation voltage value is lower, the output current value that is allowed is higher. When operation pulse frequency is lower, the output current value that is allowed is lower. When the operation pulse frequency is higher, the output current value that is allowed is higher. To protect relating to each of characteristic lines 60 by the characteristic line 62 of constant threshold current value described in FIG. 5, threshold current value=18 A is set. When threshold current value=18 A is set, protection can be performed in case of DC. The current amplifier circuit 14 cannot sufficiently operate against pulse input other than DC and a part of ability of the current amplifier circuit 14 is only used.

In FIG. 7, the load lines are illustrated when emitter resistor $R_{BE}$ of Q1 is added to RL=0 ohm, 1 ohm, 2 ohm, 3 ohm, and 4 ohm. In examples in FIG. 7, power source voltage value of the current amplifier circuit 14 is 65V.

When abnormality detection is performed by the first bridge circuit 50 in FIG. 6, the abnormality detection operation point is on the load line. For example, when RL is 2 ohm, larger electric power side than the load line that is illustrated as 2 ohm in FIG. 7 is detected as abnormal state and protection can be performed. The smaller electric power side than the load line that is illustrated can be operated safely. This is compared with the method of performing abnormality detection by a threshold current value=18 A of a conventional technique and it is understood that the allowable operation area of the current amplifier circuit 14 can be wide properly.

The first bridge circuit 50 in FIG. 6 is effective against plus side operation, but it is not effective against minus side operation. When the emitter of Q1 is connected to the emitter of Q4, amplitude deflects to the minus side, current flows in opposite direction, and detection sensitivity changes.

Figure 8:
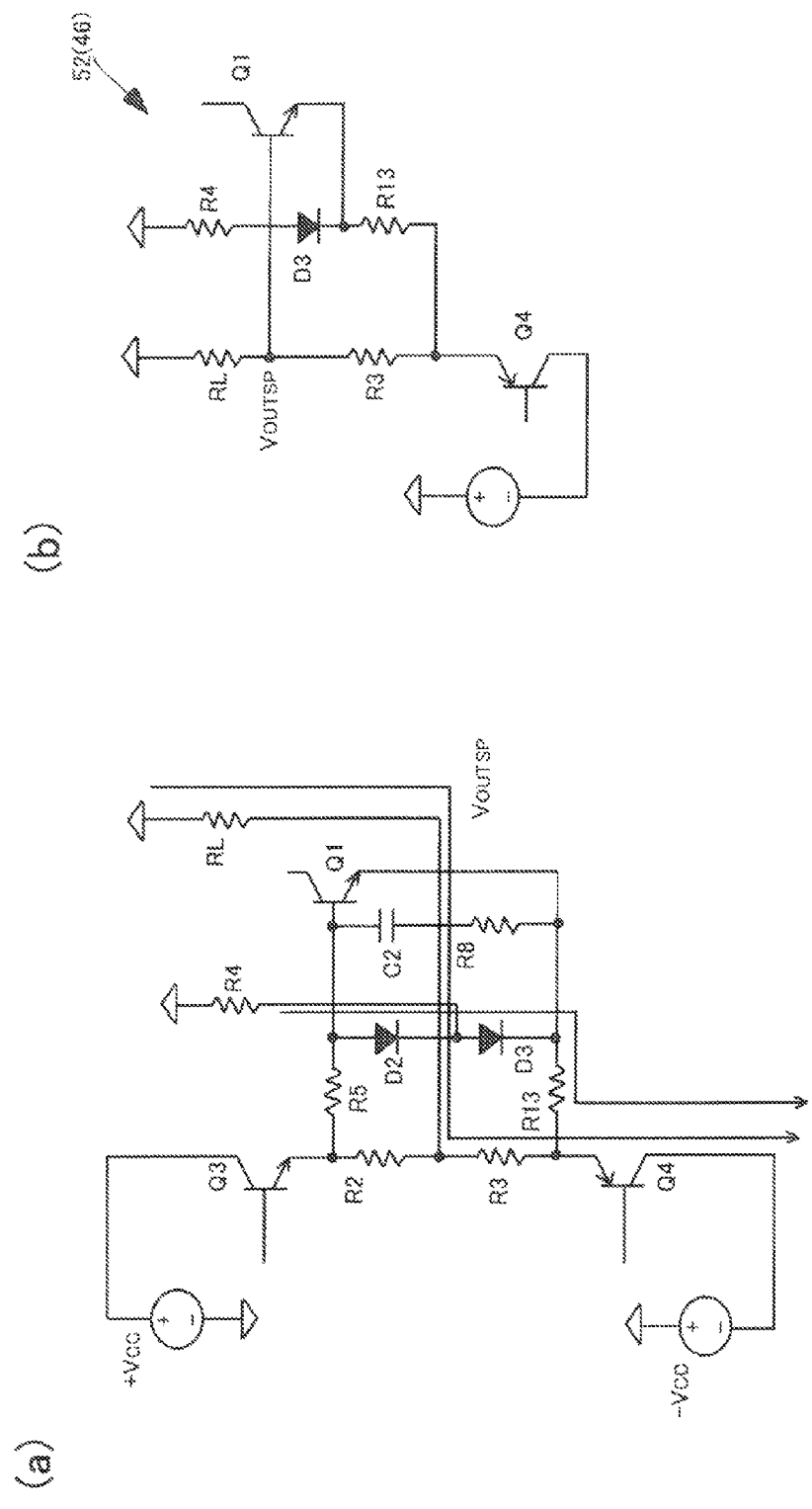
FIG. 8 is a detailed diagram of a second bridge circuit for protecting a negative side element in the protection device according to the embodiment of the present invention.

FIG. 8 (a) is a diagram extracting a part that is connected to the emitter of Q1 about abnormality detection of the output current value $I_{OUT}(-)$ by Q4. FIG. 8 (b) is a diagram extracting a part that configures the second bridge circuit 52 in FIG. 8 (a) schematically.

In FIG. 8, R13 is connected to the emitter of Q1 via the diode D3 and a connecting point between R3 and RL is connected to the base of Q1. Under connecting relation in FIG. 8(a), flow in which two current flows from GND to Q4 is illustrated. As illustrated in FIG. 8 (b), the connecting relation configures the second bridge circuit 52.

In the second bridge circuit 52, the emitter voltage value of Q1 is decided by resistive dividing ratio of a resistor R13 (a second resistor) and R4. The base voltage value of Q1 is decided by resistive dividing ratio of R3 and RL. Namely, a voltage value between the base and the emitter that decides the voltage value that Q1 is ON is decided by size relation of R3/RL and R13/R4. Compared with the first bridge circuit 50, R5 is replaced by R13 and R2 is replaced by R3. Therefore, the second bridge circuit 52 also performs the same function as the first bridge circuit 50.

Thus, the bridge circuit 46 that includes the first bridge circuit 50 and the second bridge circuit 52 changes the control voltage value of the abnormality detection element that detects the abnormal current value depending on a resistor value of the speaker 16 that is the load.

Herein, back to FIG. 7 (a), by using the bridge circuit 46, the lager current side than the load line can be detected as abnormal state by abnormality detection operation point on the load line. However, the operation capability area that the current amplifier 14 originally has is also detected as abnormal state. When the load line is RL=2 ohm in an example of FIG. 7 (a), the protection device 30 detects the area 68 illustrated by oblique lines in operation capability area that the current amplifier 14 originally has as abnormal state although the area 68 is allowed to be used relating to 1 ms pulse as illustrated in FIG. 7 (b).

The pulse response characteristic changing unit 44 of the detection circuit 32 is provided so that the area 68 is not detected as abnormal state. The pulse response characteristic changing unit 44 includes a lag lead filter circuit 48. As illustrated in FIG. 2, the lag lead filter circuit 48 is a circuit that C2 and R8 are connected in series in the bridge circuit 46. By setting constant of C2 and R8 in the lag lead filter circuit 48 properly, the pulse response characteristic of the bridge circuit 46 can be changed. For this reason, frequency characteristic of abnormality detection operation by the load line detection unit 42 can be changed.

Figure 9:
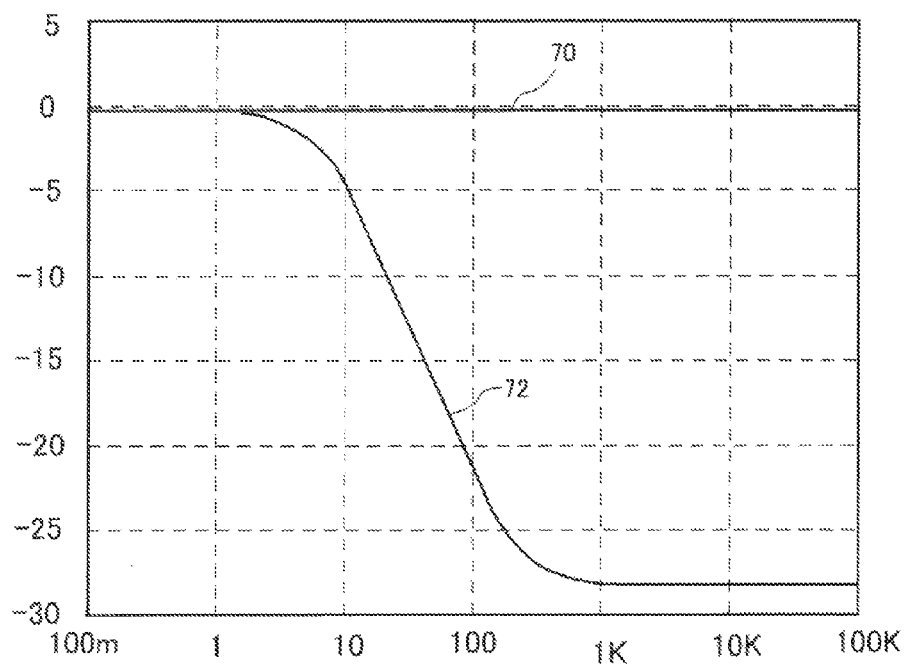
FIG. 9 is a diagram illustrating pulse response characteristic of a bridge circuit in the protection device of the embodiment of the present invention.

FIG. 9 is a diagram illustrating an example in which frequency response characteristic of the bridge circuit 46 is changed by setting constant of C2 and R8 in the lag lead filter circuit 48. A horizontal axis illustrates frequency. A vertical axis illustrates the gain of the lag lead filter circuit 48. A characteristic line 70 is gain-frequency characteristic when the lag lead filter circuit 48 is not provided. The characteristic line 70 has high gain in all area. In contrast, a characteristic line 72 is gain-frequency characteristic when the lag lead filter circuit 48 is provided. In the characteristic line 72, the gain is dropped in the frequency area not less than 100 Hz by setting constant of C2 and R8 properly. "Not less than 100 Hz" corresponds to pulse not more than 10 ms.

The first bridge circuit 50 is described. By using the lag lead filter circuit 48 that has gain-frequency characteristic of the characteristic line 72, in low-speed side, the base voltage value of Q1 performs abnormality detection by value that is defined by R4 and R5. In high-speed side, abnormality detection is performed by value is defined by R4, R5, C2, and R8.

Figure 10:
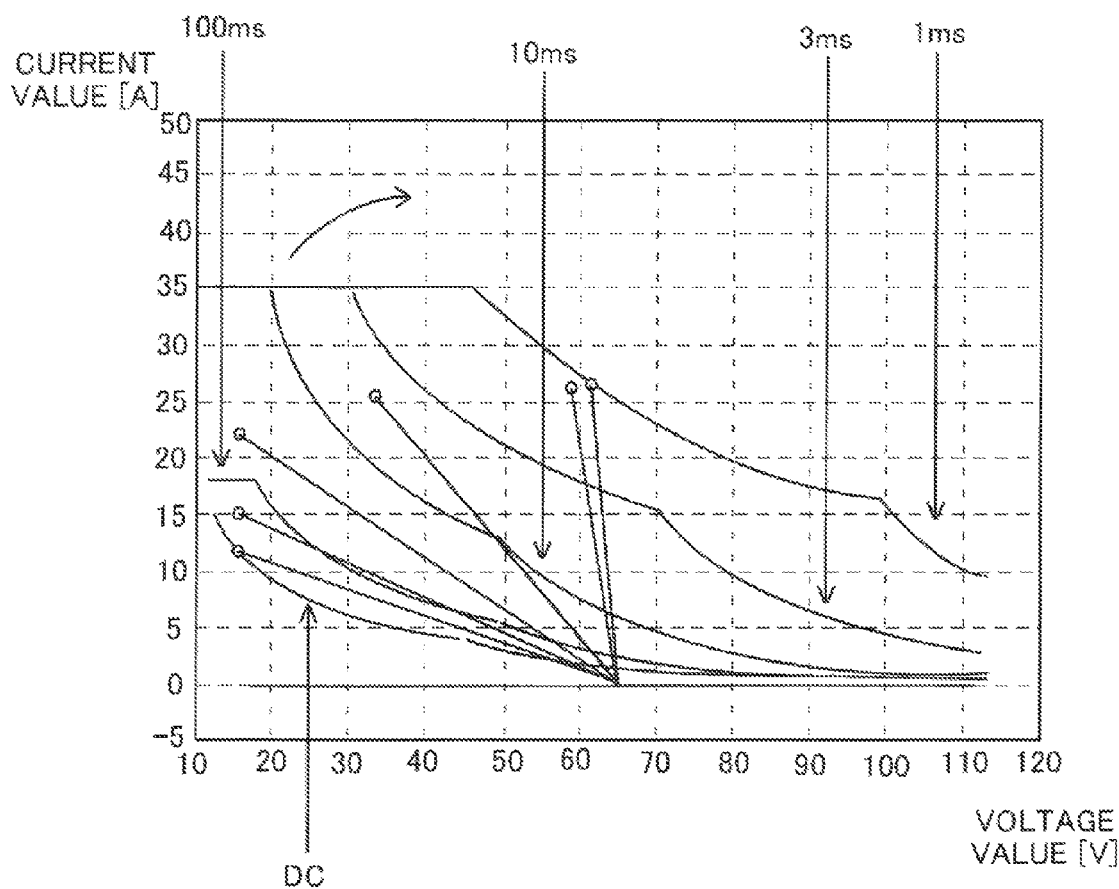
FIG. 10 is a diagram illustrating an example in which the abnormality detection operation point is changed depending on the pulse width of a current amplifier circuit in the protection device of the embodiment of the present invention.

FIG. 10 illustrates a simulation result schematically. FIG. 10 corresponds to FIG. 7. By using the lag lead filter circuit 48 that has gain-frequency characteristic of the characteristic line 72, in a low frequency side, abnormality detection is performed on the load line illustrated as 2 ohm. In a high frequency side, the abnormality detection operation point is moved to a direction illustrated by an arrow. In the area 68 of FIG. 7, abnormality detection is not performed and the area of safe operation is used effectively. In FIG. 10, a protection detection point is surrounded by a circle.

One example of a result of simulation is illustrated. When a load line of 0.1 ohm is used with 100 ms pulse width, abnormality detection is performed with 5.8 A. The area of safe operation of 100 ms in FIG. 10 is not exceeded. Further, when the load line of 0.1 ohm is used with 1 ms pulse width, the abnormality detection is performed with 25 A. It is illustrated that the abnormality detection can be properly performed in the area 68 in FIG. 7.

The embodiment of the present invention is described above, but the mode to which the present invention is applicable is not limited to the above embodiment and can be suitably varied without departing from the scope of the present invention.

In the above embodiment, Q1 is an NPN transistor, Q8 is a PNP transistor, and U1 is a PNP transistor. Not limited to this, Q1 may be a PNP transistor, Q8 may be an NPN transistor, Q9 may be a PNP transistor, and U1 may be an NPN transistor.

What is claimed is:

1. A protection device comprising: a detection circuit that detects an output current value of a current amplifier circuit and outputs a first abnormality detection signal when the output current value is an abnormal current value;
   a maintenance circuit that outputs a second abnormality detection signal continuously for predetermined maintenance time that is started from output timing of the first abnormality detection signal;
   a relay device that cuts connection between the current amplifier circuit and a load from timing that supply of driving voltage is cut and after recovery time that is mechanism cutting delay time;
   a protection mute unit that outputs a mute control signal at timing that the second abnormality detection signal is received;
   a mute circuit that includes function to turn down an input voltage value to the current amplifier circuit at timing that the mute control signal is received; and
   a protection relay command unit that cuts supply of the driving voltage at timing that the second abnormality detection signal is received, wherein
   the detection circuit includes
   a load line detection unit that detects abnormality by a current value on a load line based on a power source voltage value of the current amplifier circuit and a resistor value of the load, and
   a pulse response characteristic changing unit that changes pulse response characteristic of abnormality detection operation by the load line detection unit.

2. The protection device according to claim 1, wherein the predetermined maintenance time is set longer than the recovery time.

3. The protection device according to claim 1, wherein the load line detection unit includes a bridge circuit that changes a control voltage value of an abnormality detection element that detects an abnormal current value depending on a resistor value of the load.

4. The protection device according to claim 3, wherein the pulse response characteristic changing unit includes a lag lead filter circuit that changes pulse response characteristic of the bridge circuit depending on pulse width of the current amplifier circuit.

5. The protection device according to claim 3, wherein the bridge circuit includes
 a first bridge circuit that handles an abnormal current value of a positive side output current value of the current amplifier circuit, and
 a second bridge circuit that handles an abnormal current value of a negative side output current value of the current amplifier circuit.

6. The protection device according to claim 1, wherein the detection circuit includes
 a first transistor of NPN type in which a base is connected to the load line detection unit and the pulse response characteristic changing unit via a first resistor, an emitter is connected to the load line detection unit and the pulse response characteristic changing unit via a second resistor, and a collector is connected to the maintenance circuit via a third resistor,
 the maintenance circuit includes
 a second transistor of PNP type in which a base is connected to the collector of the first transistor via the third resistor, an emitter is connected to a power source, and a collector is connected to a microcomputer via a fourth resistor and that generates abnormality detection voltage as the abnormality detection signal at the collector, and
 a third transistor of NPN type in which a base is connected to collector of the second transistor via a condenser and a fifth resistor, an emitter is connected to the ground potential, and a collector is connected to the protection mute circuit and base of the second transistor via a sixth resistor and generates abnormality detection voltage as the second abnormality detection signal at collector.

7. The protection device according to claim 1, wherein the detection circuit includes
 a first transistor of PNP type in which a base is connected to the load line detection unit and the pulse response characteristic changing unit via a first resistor, an emitter is connected to the load line detection unit and the pulse response characteristic changing unit via a second resistor, and a collector is connected to the maintenance circuit via a third resistor,
 the maintenance circuit includes
 a second transistor of NPN type in which a base is connected to the collector of the first transistor via the third resistor, an emitter is connected to a power source, and a collector is connected to a microcomputer via a fourth resistor and that generates abnormality detection voltage as the second abnormality detection signal at collector, and
 a third transistor of PNP type in which a base is connected to the collector of the second transistor via a condenser and a fifth resistor, an emitter is connected to the ground potential, and a collector is connected to the protection mute circuit and the base of the second transistor via a sixth resistor and generates abnormality detection voltage as the second abnormality detection signal at the collector.

8. The protection device according to claim 1, wherein the protection mute unit include a fourth transistor of PNP type in which a base is connected to the maintenance circuit via a diode, an emitter is connected to a power source, and a collector is connected to the mute circuit.

9. The protection device according to claim 1, wherein the protection mute unit include a fourth transistor of NPN type in which a base is connected to the maintenance circuit via a diode, an emitter is connected to a power source, and a collector is connected to the mute circuit.

\* \* \* \* \*